United States Patent
Jost

(10) Patent No.: US 8,373,335 B2
(45) Date of Patent: Feb. 12, 2013

(54) ACTUATOR ELEMENT AND USE OF SAME

(75) Inventor: Oliver Jost, Dresden (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 181 days.

(21) Appl. No.: 13/059,527

(22) PCT Filed: Aug. 19, 2009

(86) PCT No.: PCT/DE2009/001198
§ 371 (c)(1),
(2), (4) Date: Mar. 17, 2011

(87) PCT Pub. No.: WO2010/020242
PCT Pub. Date: Feb. 25, 2010

(65) Prior Publication Data
US 2011/0187238 A1    Aug. 4, 2011

(30) Foreign Application Priority Data
Aug. 20, 2008   (DE) .......................... 10 2008 039 757

(51) Int. Cl.
*H01L 41/047*    (2006.01)
(52) U.S. Cl. ....................................... 310/800; 310/363
(58) Field of Classification Search ................ 310/363, 310/800
See application file for complete search history.

(56) References Cited

U.S. PATENT DOCUMENTS

| 7,678,564 B2 * | 3/2010 | Muller-Hartmann et al. .......................... 435/285.2 |
| 2002/0050454 A1 | 5/2002 | Shahinpoor et al. |
| 2005/0214562 A1 * | 9/2005 | Muller-Hartmann et al. .............................. 428/615 |
| 2008/0128663 A1 * | 6/2008 | Chaput et al. ................. 252/511 |

FOREIGN PATENT DOCUMENTS

| DE | 10058096 | 6/2002 |
| DE | 10244312 | 4/2004 |
| DE | 10328347 | 2/2005 |
| DE | 60 2004003550 | 9/2007 |
| WO | 99/17929 | 4/1999 |
| WO | 01/06579 | 1/2001 |
| WO | 2006/123317 | 11/2006 |
| WO | 2007/029275 | 3/2007 |
| WO | WO 2008/056851 A1 * | 5/2008 |
| WO | WO 2009/017911 * | 2/2009 |

OTHER PUBLICATIONS

Sekitani et al., "A Rubberlike Stretchable Active Matrix Using Elastic Conductors, Science," www.sciencemag.org, vol. 321, Sep. 12, 2008, pp. 1468-1472.

* cited by examiner

*Primary Examiner* — Thomas Dougherty
(74) *Attorney, Agent, or Firm* — Fay Kaplun & Marcin, LLP

(57) ABSTRACT

Actuator elements can be used for mechatronic, adaptive applications under the most varied conditions of use. These actuator elements have improved properties and can be manufactured inexpensively. The actuator elements are formed with at least one dielectric separation layer which is encompassed by two electrically conductive electrodes. The electrodes and the separation layer are in this respect formed using the same visco-elastically deformable plastic. The plastic forms a matrix in which carbon nanotubes are embedded at least in the electrodes.

16 Claims, 1 Drawing Sheet

ACTUATOR ELEMENT AND USE OF SAME

FIELD OF INVENTION

The invention relates to actuator elements and to a use of same which can be used for mechatronic adaptive applications under the most varied conditions of use. In this respect, using the actuator elements in accordance with the invention, their changes in shape and size can be used, for example, to initiate movements or to exert an application of force. They can inter alia be used analog to piezo elements.

BACKGROUND INFORMATION

Piezo elements can, however frequently not be used or can only be used insufficiently due to their mechanical properties and the limited stretchability. The manufacturing costs can also be too high.

Attempts have thus been made in the past to provide actuators with dielectric elastomer plastics. In this respect, however, due to the high elongations, there are problems with the electric contact and connection of the required electrodes which should be preset under all conditions of use.

The required contact voltages are in a region of 100 kV which can frequently not be controlled or used.

The properties of the material for the dielectric part and the electrodes also differ considerably in many points, which has a particularly unfavorable effect with changed conditions of use or environment.

Usually, metal electrodes are used which, however, have completely different mechanical properties than the relatively soft elastomers. The operation of such actuators therefore usually suffers under the failure of the electrodes.

With highly stretchable elastomers, electrodes should have a similar stretching behavior. Electrodes are therefore manufactured using electrically conductive graphite flakes which are applied to polymer surfaces with a silicone oil. In this respect, however, an actually dry "actuator" has a partly liquid coating applied. This is, however, very unfavorable in a stack structure with an alternation of electrodes and polymer layers. Electrodes formed in this manner are very slick and therefore represent mechanical weak points. In addition, the optical transparency is substantially impaired.

It is known for the formation of optically transparent electrodes which can be used, for example, in organic light emitting diodes (OLEDs) to apply and dry carbon nanotubes (CNTs) in a dispersion so that they are formed in layer form on the luminous organic layers and are in this respect also electrically conductive. The CNTs are in this respect included in a relatively high proportion in an organic matrix, with a compromise having to be made between electrical conductivity and optical transparency with regard to the respective proportion of CNTs and the electrode thickness.

The electrodes manufactured in this manner likewise have greatly different properties from the other components of such OLEDs.

It is known from T. Sekitani inter alia from "A Rubberlike Stretchable Active Matrix Using Elastic Conductors", Science Express Online, Aug. 7, 2008, to manufacture electrically conductive flexible elements from plastic which are electrically conductive and can simultaneously be stretched. In this respect, CNTs should be added into liquid vinylidene fluoride-hexafluoropropylene with an addition of ionic 1-butyl-3-methylimidazolium bisimide and the mixture thus obtained should then be applied to a glass support. The composite material obtained could then be connected to stretchable silicone rubber. The electrical conductivity can be increased by a high proportion of 20 mass percent of CNTs. The electrically conductive part with the CNTs and the silicone rubber, however, also again have mutually different properties and form a material composite of different materials having different mechanical properties, whereby such actuator elements have a shortened service life or degraded properties.

SUMMARY OF INVENTION

It is therefore the object of the invention to provide actuator elements which have improved properties and can be manufactured inexpensively.

In accordance with the invention, this object is achieved by an actuator element having the features of claim 1. Uses are set forth in claim 16. Advantageous embodiments and further developments can be achieved using features designated in the subordinate claims.

The actuator elements in accordance with the invention are formed with at least one dielectric separation layer which is encompassed by two electrically conductive electrodes. The electrodes and the separation layer are in this respect formed with the same entropy-elastically (rubber-elastically) deformable plastic. Such suitable plastics can also be called elastomers or thermoplastic elastomers. The plastic forms a matrix in which carbon nanotubes are embedded at least in the electrodes. The proportion of carbon nanotubes should be kept in the range of 0.001 to 30 mass percent, preferably up to 1 mass percent.

A large ratio of length to outer diameter and the use of single-wall carbon nanotubes (SWCNTs) have an advantageous effect. The ratio of length to outer diameter should be selected as at least 8:1, preferably 100:1. The maximum outer diameter should not exceed 100 nm.

Dielectric separation layers should have a layer thickness in the range of 100 nm to 5 mm and electrodes should have layer thicknesses in the range of 100 nm to 5 mm.

Elastically deformable plastics can be used which allow a stretching by at least 5% until the breaking point is reached at temperatures of use. In this respect, entropy-elastically deformable plastics should be understood as such whose glass transition temperature lies below a temperature of use, wherein this temperature should as a rule be the room temperature so that the glass transition temperature should then be below 0° C.

It is particularly advantageous in the actuator elements in accordance with the invention that they are substantially formed from the same material and no border or barrier layers separate the electrodes and the separation layer from one another so that they merge directly into one another. The carbon nanotubes contained at least in the electrodes only insignificantly change the material properties, if at all. Only the electrical conductivity is increased by orders of magnitude.

Carbon nanotubes having a smaller proportion than in the electrodes can also be embedded in the dielectric separation layer, whereby the properties can be further matched. In this respect, the percolation threshold should not be exceeded.

Due to the small required proportions of embedded carbon nanotubes, optical transparency or translucence can also be achieved at least in a partial range of the wavelength spectrum of visible light with a suitably selected plastic. The transparency should amount to at least 50% in this respect. Optically transparent actuator elements can be utilized as optical elements in which the refractive index and/or the focal length can be changed.

It is particularly advantageous to form actuator elements as layer stacks in which more than two electrodes and a dielectric separation layer are present. Such a layer stack can be used in a housing element open at least one end face, for example in a hollow cylinder. A deformation in only one axial direction can thereby be utilized. Electrical connectors for the electrical contact of the electrodes can then be present at the inner wall of the housing element. An actuator element can in this respect be inserted into a housing element fit such that a force acts on the elastomer plastic, the actuator element is thereby compressed and biased.

An actuator element can, however, also be formed as a spiral winding of mutually connected electrodes with a dielectric separation layer. The actuator element formed in this manner has the shape of a cylinder. It can exert compressive forces in the direction of the cylinder axis.

It can moreover be favorable to use carbon nanotubes having a functionalized surface. In this respect, types of doping can be selected which increase the electrical conductivity. Suitable metallic elements and metal ions can be used for this purpose. There is, however, also the possibility of functionalizing them chemically to achieve improved surface properties with respect to the wettability with the respective plastic so that the embedding into the plastic matrix before the polymerization or wetting is facilitated.

Examples for suitable plastics are: polyurethanes, polyacrylates or silicones (e.g. silicone rubber or silicone resins).

Polymer mixtures, that is, so-called polyblends, can also be used with which a large matching to properties desired for the respective application can be carried out. There is also the possibility of using plastics with which visco-elastic deformations can also be achieved which can also be relaxable.

Using the basic active principle, an actuator element can, however, also be used as a sensor element or as a combination of actuator/sensor in order, for example, to detect forces or pressures and/or to exert such effects.

A damping and also the excitation of oscillations are, however, also possible using actuator elements in accordance with the invention. In this respect, a noise attenuation can be achieved, also of structure-borne noise. A use in acoustics is also possible.

In addition to the utilization of changeable haptics, actuator elements can also be used in medical engineering (bionics), for example as artificial muscles.

Influence can be taken on the electrical properties by a selective choice of carbon nanotubes with respect to their length to outer diameter ratio. This also relates to the frequency at which the relative permittivity of the dielectric separation layer becomes a maximum. The width of the frequency interval at which the relative permittivity can be kept at a maximum can, however, also be influenced. In this respect, a smaller frequency can be achieved with thinner and longer carbon nanotubes than with thicker and shorter ones. The width of the distribution of the outer diameters of carbon nanotubes which are embedded influences the width of the frequency interval in which the relative permittivity can be at a maximum. A narrow outer diameter distribution results in a smaller frequency interval than a wider outer diameter distribution.

Actuator elements in accordance with the invention can be manufactured, for example, so that carbon nanotubes are dispersed in the respective plastic with a suitable viscosity. In this respect, a solvent suitable for the plastic can be used. A film for dielectric separation layers can be manufactured using the plastic in which optionally a small proportion of carbon nanotubes is contained and further for films having higher proportions of carbon nanotubes. These films can then be connected to one another before a polymerization, polycondensation or crosslinking has taken place. An actuator element can thus be obtained as a uniform polymer body.

There is, however, also the possibility of functionalizing the surface of such films and then of joining together films for electrodes and dielectric separation layers while applying compressive force so that a strong composite of separation layer and electrodes can be achieved. A solvent for the respective plastic can be applied and the surface can be allowed to start to dissolve for the surface functionalization.

The actuator element in accordance with the invention can in the ideal case also be manufactured in a full polymer process and can therefore also be manufactured very inexpensively. At least the mechanical and substantially also the thermal properties of the electrodes and separation layers are at least almost the same. The service life can thereby also be positively influenced.

The effective spacing between electrodes can be reduced by the use of the thin and long carbon nanotubes in separation layers due to the formation of incomplete electrical routing paths between the electrodes, whereby the required electrical voltage can be substantially reduced. Depending on the individual case and frequency, a use under biocompatible conditions such as in medical engineering or biometrics can thereby also be possible.

The self-healing effects in operation which are known per se and can be achieved with carbon nanotubes and the effect of tensile and compressive strains on actuator elements can be utilized since cut-through channels which have occurred can be closed by visco-plastic portions of the elastomer plastic. Border layer effects between the electrodes and the separation layer can be avoided or their effect can be greatly reduced using a similar and tight meshing of the nanotubes in electrodes and optionally in the separation layer in combination with the same plastic matrix material.

By a suitable selection of the respective plastic, its properties e.g. the modulus of elasticity, can be adapted to the respective application. The actuator elements can be provided in a suitable size and also geometrical design.

Much larger actuating paths or deformations can be achieved in comparison with piezo actuators. The energy requirements for operation is also small since no constant electric current flow is required. A small electric current is also required for operation so that correspondingly small heat losses can also be achieved.

BRIEF DESCRIPTION OF DRAWINGS

The invention will be explained in more detail by way of example in the following.

There are shown.

DETAILED DESCRIPTION

Figure 1:
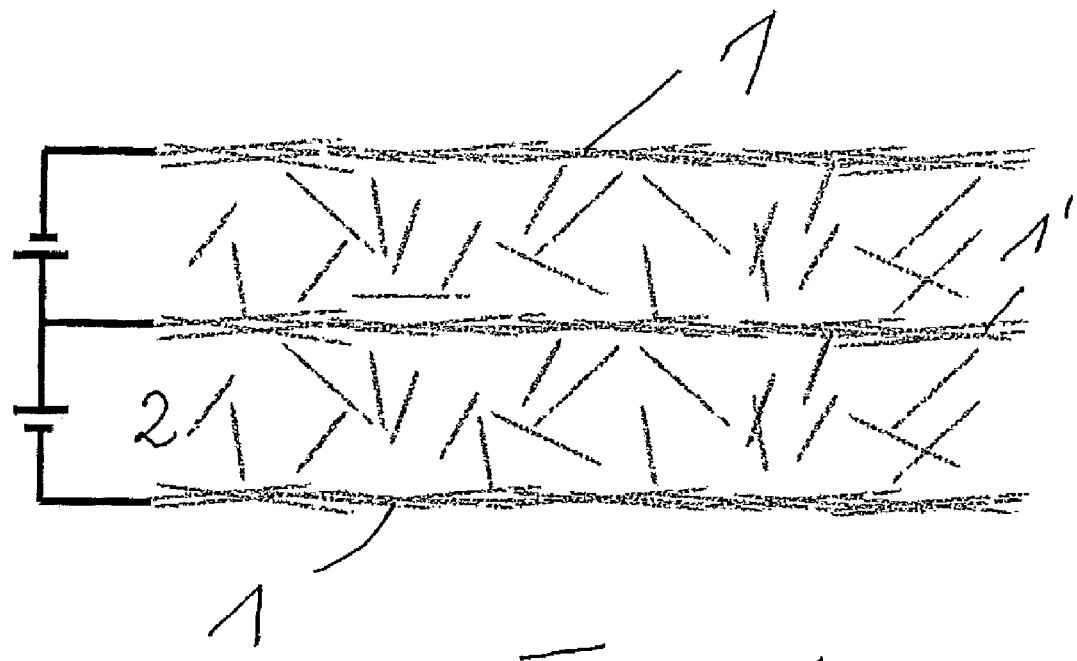
FIG. 1 in schematic form, a section through an example of an actuator element in accordance with the invention.

A structure of an example of an actuator element should be shown by FIG. 1 in which two electrodes 1 and 1', which are connected to different poles of an electrical voltage source, encompass a dielectric separation layer. It becomes clear in this respect that carbon nanotubes are embedded in the electrodes 1 and 1', and also in the two separation layers 2 in the plastic matrix. The proportion of carbon nanotubes per volume unit is much higher in the electrodes 1 and 1' and reaches 0.5 mass percent therein. The percolation threshold is therefore exceeded in the electrodes 1 and 1'. In the region of the separation layers 2, their proportion is smaller and is here 0.05 mass percent so that the percolation threshold is not exceeded. With this example, it can also be pointed out that layers stacks can be manufactured with a larger number of electrodes 1 and 1' and separation layers 2. The electrodes 1 and 1' form an electric capacitor with the separation layer 2 arranged between them.

Figure 2:
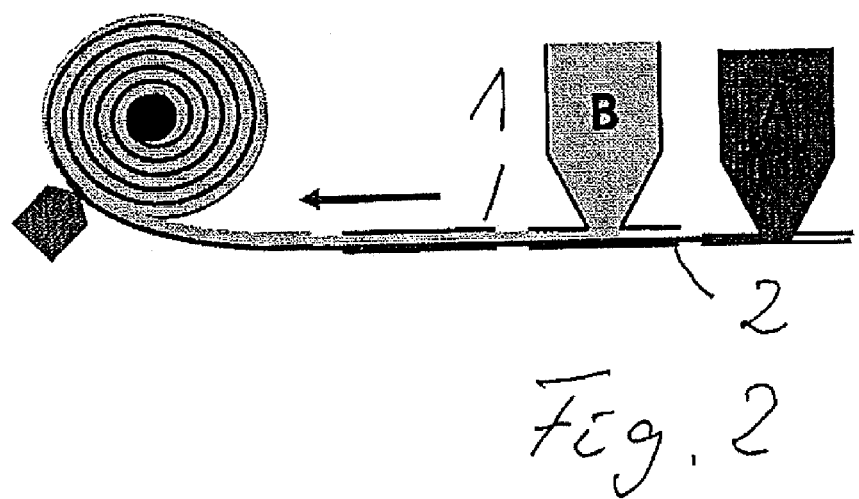
FIG. 2 a possibility for manufacturing actuator elements.

A possibility for manufacturing actuator elements should be addressed by FIG. 2. In this respect, a film B for an electrode 1 is here applied to as film A for a dielectric separation layer 2. In this respect, the films A and B still have sufficient viscosity, at least at the surface to be connected, with which a connection of both films A and B is possible. The film composite can subsequently be rolled up. Beforehand, or after the rolling up, a complete polymerization, polycondensation, a hardening, a crosslinking or an evaporation of solvent can be carried out, while taking account of the plastic with which the electrode 1 and the separation layer 2 are formed, and a permanent, strong composite can thereby be achieved. A second electrode 1' in a form not shown can, analog to the electrode 1, be connected to the separation layer 2 on the oppositely disposed side thereof for the manufacture of an actuator element.

The invention claimed is:

1. An actuator element, comprising:
   electrically conductive electrodes; and
   at least one dielectric separation layer encompassed at both surfaces by the respective electrically conductive electrodes, the separation layer and each of the electrodes being formed using an entropy-elastically deformable plastic matrix, the plastic matrix of the separation layer and of the electrodes being identical at a temperature of use,
   wherein carbon nanotubes are embedded at least in the plastic forming the electrodes.

2. The actuator element of claim 1, wherein a proportion of the carbon nanotubes of electrodes embedded in the plastic matrix is maintained in a range between 0.01 and 30 mass percent.

3. The actuator element of claim 1, wherein the carbon nanotubes having a ratio of a length to an outer diameter of at least 8:1 are embedded.

4. The actuator element of claim 1, wherein the plastic has a stretchability of at least 5% until a breaking point is reached at the temperatures of use.

5. The actuator element of claim 1, wherein single-wall carbon nanotubes are embedded.

6. The actuator element of claim 1, wherein the carbon nanotubes having a maximum outer diameter of 100 nm are used.

7. The actuator element of claim 1, wherein the electrodes and the separation layer merge directly into one another.

8. The actuator element of claim 1, wherein a plurality of the actuator elements form a layer stack.

9. The actuator element of claim 1, wherein the carbon nanotubes contained in the separation layer having a smaller proportion than the carbon nanotubes in the electrodes.

10. The actuator element of claim 1, wherein the actuator element has a transparency of at least 50% at least in a partial range of a wavelength range of visible light.

11. The actuator element of claim 1, wherein carbon nanotubes having at least one of (a) a defined length to an outer diameter ratio and (b) a defined length to a distribution ratio for a direct influencing of at least one of (I) a frequency at which a relative permittivity of the dielectric separation layer is at a maximum and (II) the width of the frequency interval in which the relative permittivity can be kept at the maximum.

12. The actuator element of claim 1, wherein the dielectric separation layer has a layer thickness in a range between 100 nm and 5 mm and the electrodes have a layer thickness in a range between 100 nm and 5 mm.

13. The actuator element of claim 1, wherein a layer stack having electrodes and separation layers arranged above one another are arranged within a housing element, wherein the housing element is open at its end faces and has, at an inner wall, electrical connectors for the contacting of electrodes.

14. The actuator element of claim 1, wherein the carbon nanotubes are used which are functionalized at their surface.

15. The actuator element of claim 1, wherein an entropy-elastically deformable plastic matrix for the separation layer and the electrodes is formed from one of a polyurethane, a polyacrylate and a silicone.

16. The actuator element of claim 1, wherein the actuator element is included in one of a sensor element, an actuator/sensor element, an optical element, an oscillating damping and an exciting element.

* * * * *